(12) United States Patent
Kishimoto et al.

(10) Patent No.: US 11,043,635 B2
(45) Date of Patent: Jun. 22, 2021

(54) VAPOR-DEPOSITION MASK HAVING FRAME FORMED OF CARBON-FIBER REINFORCED PLASTIC, VAPOR-DEPOSITION METHOD AND METHOD FOR MANUFACTURING ORGANIC EL DISPLAY APPARATUS

(71) Applicant: SAKAI DISPLAY PRODUCTS CORPORATION, Sakai (JP)

(72) Inventors: Katsuhiko Kishimoto, Sakai (JP); Susumu Sakio, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 36 days.

(21) Appl. No.: 16/343,719

(22) PCT Filed: Dec. 25, 2017

(86) PCT No.: PCT/JP2017/046411
§ 371 (c)(1),
(2) Date: Jul. 30, 2019

(87) PCT Pub. No.: WO2019/130388
PCT Pub. Date: Jul. 4, 2019

(65) Prior Publication Data
US 2021/0028364 A1 Jan. 28, 2021

(51) Int. Cl.
*H01L 51/00* (2006.01)
*C23C 14/04* (2006.01)
*C23C 14/12* (2006.01)
*C23C 14/24* (2006.01)
*H01L 51/56* (2006.01)

(52) U.S. Cl.
CPC ........ *H01L 51/0011* (2013.01); *C23C 14/042* (2013.01); *C23C 14/12* (2013.01); *C23C 14/24* (2013.01); *H01L 51/56* (2013.01); *H01L 2227/323* (2013.01)

(58) Field of Classification Search
CPC ................. H01L 51/0011; H01L 51/56; H01L 2227/323; C23C 14/24; C23C 14/042; C23C 14/12
See application file for complete search history.

(56) References Cited

U.S. PATENT DOCUMENTS

2019/0044070 A1* 2/2019 Nishida .................... C23C 14/24
2019/0100834 A1* 4/2019 Sakio ....................... C23C 14/24
2019/0284678 A1* 9/2019 Lifka ..................... C23C 14/562

FOREIGN PATENT DOCUMENTS

| JP | 2006-322015 A | 11/2006 |
| JP | 2010-524241 A | 7/2010 |
| JP | 2011-516736 A | 5/2011 |
| JP | 2014-205870 A | 10/2014 |
| WO | 2008/124421 A1 | 10/2008 |
| WO | 2009/127272 A1 | 10/2009 |
| WO | 2017/158858 A1 | 9/2017 |

* cited by examiner

*Primary Examiner* — Kyoung Lee
*Assistant Examiner* — Christina A Sylvia
(74) *Attorney, Agent, or Firm* — ScienBiziP, P.C.

(57) ABSTRACT

A rigid material whose linear expansion coefficient is small and whose relative density is small is used to provide a vapor-deposition mask using a lightweight and highly dimension-accurate frame. A frame (15) of the vapor-deposition mask disclosed in accordance with the present embodiment is formed with a carbon-fiber reinforced plastic (CFRP).

10 Claims, 8 Drawing Sheets

VAPOR-DEPOSITION MASK HAVING FRAME FORMED OF CARBON-FIBER REINFORCED PLASTIC, VAPOR-DEPOSITION METHOD AND METHOD FOR MANUFACTURING ORGANIC EL DISPLAY APPARATUS

TECHNICAL FIELD

The present invention relates to a vapor-deposition mask, a vapor-deposition method, and method for manufacturing an organic-EL display apparatus that vapor-deposits an organic layer of an organic-EL display apparatus, for example.

BACKGROUND ART

When an organic-EL display apparatus is manufactured, a driving element such as a TFT is formed on a substrate, on which electrode organic layers are deposited in correspondence for each pixel. This organic layer is susceptible to moisture, so that it cannot be subjected to etching. Therefore, as shown in FIG. 8, for example, deposition of an organic layer 80 is carried out by overlapping a vapor-deposition mask 82 comprising a mask main body 821 and a frame 822 and a substrate to be vapor-deposited 81 and vapor-depositing an organic material 85a of a vapor-deposition source 85 through an aperture 821c of the vapor-deposition mask 82. Then, the organic layer 80 that is necessary is deposited only on an electrode 81a surrounded by an insulating film 81b for a pixel necessary. This substrate to be vapor-deposited 81 and the vapor-deposition mask 82 is to be as proximate as possible for the organic layer 80 to be formed only at an accurate pixel region. A display image tends to be blurred unless the organic material is deposited only at the accurate pixel region. Thus, a magnetic chuck method is used in which a metal supporting layer 821b being a magnetic body is used for the vapor-deposition mask 82, and the substrate to be vapor-deposited 81 is interposed between the vapor-deposition mask 82 and an electromagnet or a permanent magnet 83 which is arranged such that it is fixed with a resin 84 on a surface opposite the substrate to be vapor-deposited 81 to place the substrate to be vapor-deposited 81 and the vapor-deposition mask 82 as proximate as possible (see Patent Document 1, for example).

While a metal mask is used conventionally as the vapor-deposition mask, consideration for using a resin film 821a and a hybrid-type mask main body 821 in which a portion except for a peripheral edge of the aperture 821c of the resin film 821a is supported by a metal support layer 821b has started. This vapor-deposition mask 82 is formed by fixing it to a frame 822 at a peripheral edge of the mask main body 821 to stabilize the mask main body 821 and to make handling of the mask main body 821 convenient. In FIG. 8, reference numeral 821d is an aperture at the metal support layer 821b that is formed to be larger than the aperture 821c so as not to close the aperture 821c of the resin film 821a. A peripheral edge of the metal support layer 821b is fixed, with welding, to a frame 822 formed with a metal such as invar, which has a low thermal expansion coefficient.

PRIOR ART DOCUMENT

Patent Document

Patent Document 1: JP 2014-205870 A

SUMMARY OF THE INVENTION

Problem to be Solved by the Invention

As described previously, the vapor-deposition mask 82 is joined to the frame 822 of the mask main body 821. However, as evident from FIG. 8, at the time of vapor deposition, the frame 822 is most proximate to the vapor-deposition source 85. Therefore, the temperature of the frame 822 is most likely to rise, heat of the frame 822 heated is transmitted to the substrate to be vapor-deposited 81 and the mask main body 821 of the vapor-deposition mask 82, and the temperature of the substrate to be vapor-deposited 81 is also likely to rise. As the frame 822 is solid and weighty, causing the thermal capacity to increase, it is likely to hold the temperature once risen. As a result, the substrate to be vapor-deposited 81 is likely to rise in temperature at the peripheral edge more than at the center thereof. In other words, there is a problem that the difference in thermal expansion of the substrate to be vapor-deposited 81 is produced, making it not possible to form a uniform organic layer 80.

More specifically, this temperature distribution problem becomes conspicuous as the substrate to be vapor-deposited and the vapor-deposition mask are capsized. However, capsizing is further demanded for the vapor-deposition mask also with respect to cutting down cost by mass production. In other words, while the maximum size of the substrate to be vapor-deposited (the so-called size of a mother glass) in the process for manufacturing an organic-EL display apparatus at the present is G6H (half the size of the 6th generation (approximately 1500 mm×1800 mm), or, in other words, approximately 1500 mm×900 mm), the size of the mother glass to be used in the preceding manufacturing process of the liquid-crystal panel is over G10 (approximately 2880 mm×3130 mm), so that there is a strong demand for achieving further upsizing even with the organic-EL display apparatus. However, in the process for manufacturing an organic-EL display apparatus, it is considered difficult to make the substrate size larger than G6H. One of the factors is a problem of weight of the vapor-deposition mask.

With respect to the weight, the weight of the frame reaches approximately 80 kg even with the size of G6H as described above, which, with this weight, is close to the limit for a robot arm to convey the vapor-deposition mask, so that further increasing the weight is not possible. However, from the point of view of preventing misalignment between the substrate to vapor-deposited and the vapor-deposition mask due to thermal expansion at the time of vapor deposition, it is not possible to easily change the material for the frame of the vapor-deposition mask. Moreover, taking into account that tension is applied to the mask main body to perform joining, there is a constraint that the frame cannot be made slimmer or thinner compared to that at the present.

The present invention is made to solve such problems. An object of the present invention is to use a rigid material whose linear expansion coefficient is small and whose relative density is small to provide a vapor-deposition mask using a frame which is lightweight and has a small thermal capacity and a method of vapor deposition using the above-mentioned vapor-deposition mask.

Another object of the present invention is to provide a method for manufacturing a large-sized organic-EL display apparatus having excellent display definition using the above-described method of vapor deposition.

Means to Solve the Problem

A vapor-deposition mask according to a first embodiment of the present invention comprises: a mask main body at which an aperture pattern is formed; and a frame to which at least a portion of a peripheral edge of the mask main body is joined to hold the mask main body at a certain state, wherein the frame is formed with a carbon-fiber reinforced plastic.

A method of vapor deposition according to a second embodiment of the present invention comprises: arranging a substrate to be vapor-deposited and a vapor-deposition mask such that they overlap each other; and, by causing a vapor-deposited material to fly away from a vapor-deposition source arranged at a distance from the vapor-deposition mask, depositing the vapor-deposited material onto the substrate to be vapor-deposited.

A method for manufacturing an organic-EL display apparatus according to a third embodiment of the present invention comprises: forming at least a TFT and a first electrode on a supporting substrate; vapor-depositing an organic material on the supporting substrate using the above-described method of vapor deposition to form an organic deposition layer and forming a second electrode on the organic deposition layer.

Effects of the Invention

According to the present invention, a frame of a vapor-deposition mask is formed with a carbon-fiber reinforced plastic (CFRP). While a majority of the weight of the vapor-deposition mask is taken by the frame, this CFRP has a relative density of less than 2 and has a large mechanical strength. Moreover, a sandwich structure having a small linear expansion coefficient at no more than 3 ppm/° C. and having a gap can be used to obtain the vapor-deposition mask that can further reduce the weight and the thermal capacity. As a result, upsizing of the vapor-deposition mask can be achieved. The sandwich structure formed with a core portion in which the carbon-fiber reinforced plastic (CFRP) comprises a gap and an end plate comprising a plate of a metal such as invar can be used as a frame to make the frame more lightweight.

EMBODIMENT FOR CARRYING OUT THE INVENTION

Figure 1A:
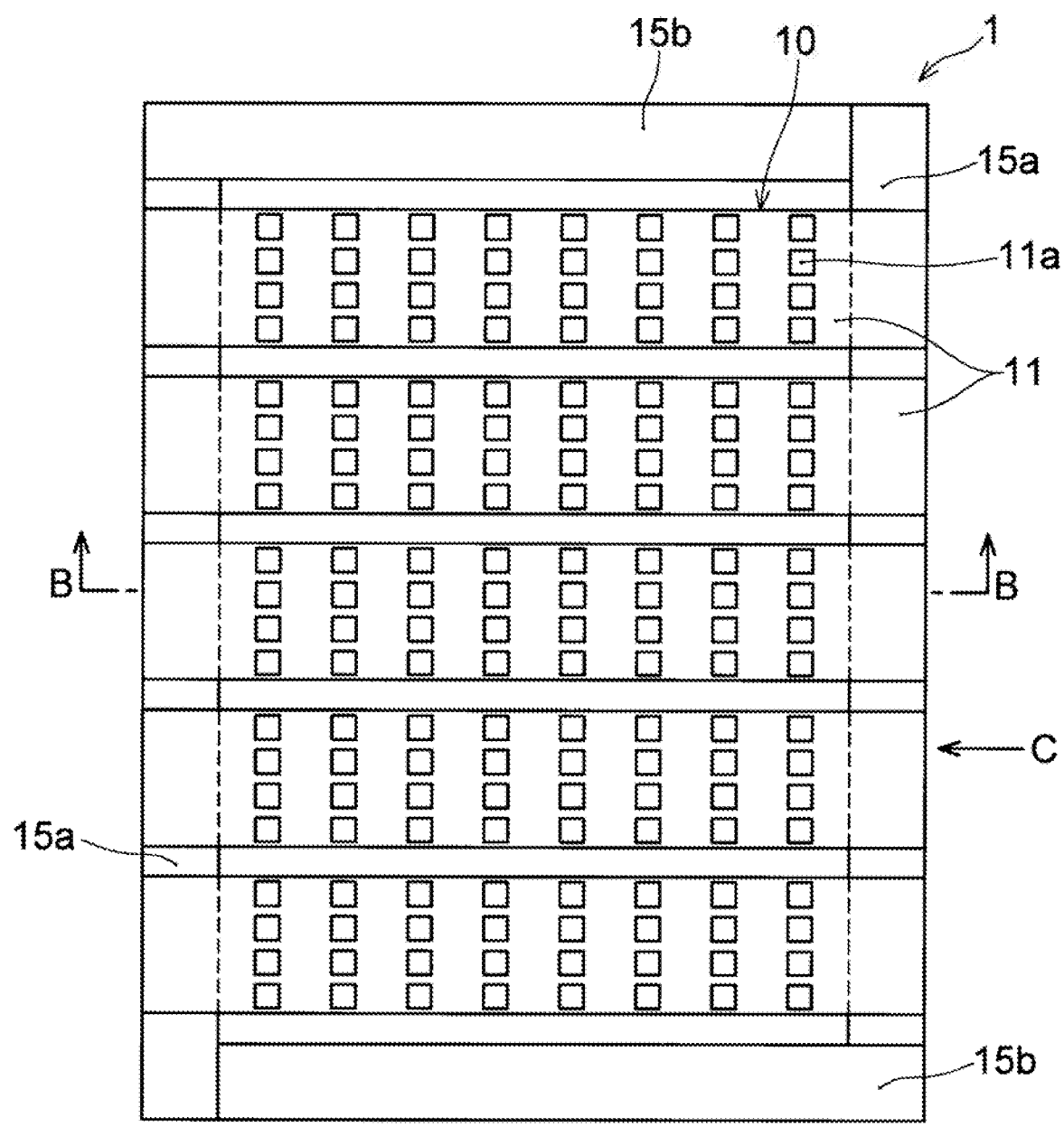
FIG. 1A shows a schematic upper surface of a vapor-deposition mask according to one embodiment of the present invention.

Next, a vapor-deposition mask according to a first embodiment and a vapor-deposition method according to a second embodiment of the present invention are described with reference to the drawings. With a plan view of a vapor-deposition mask 1, a cross-sectional view taken along a line B-B, and a view as seen from an arrow C respectively shown in FIGS. 1A to 1C, the vapor-deposition mask 1 according to the present embodiment comprises a mask main body 10 at which an aperture pattern 11a is formed and a frame 15 to which at least a portion of a peripheral edge of the mask main body 10 is joined to hold the mask body 10 at a certain state. Then, the frame 15 is formed with a carbon-fiber reinforced plastic (CFRP). It is further preferable that a material comprising this CFRP be formed as a sandwich structure 150 in which an end plate 152 formed with the CFRP or a metal plate is bonded onto a surface opposing at least a part of a columnar-shaped core portion 151 enclosing a gap 151a.

The end plate 152 being formed with the CFRP is preferable as the end plate 152 is difficult to be broken with a change in temperature, since the end plate 152 can have the same linear expansion coefficient as the core portion 151. When the end plate 152 is formed with the CFRP, plating such as nickel plating can be carried out to make it easy for the end plate 152 to join to the core portion 151 and provide the end plate 152 with magnetic property. The mask main body 10 shown in FIG. 1A is a hybrid mask in which a metal supporting layer 12 comprising an aperture 12a formed so as to not close an aperture pattern 11a of a resin film 11 is bonded to the resin film 11 on which the aperture pattern 11a is formed. However, it is construed to be not limited to such a configuration, so that the mask main body 10 is also applicable to a metal mask comprising only a thin metal plate or only the resin film 11. For a hybrid mask, the metal supporting layer 12 is joined to the frame 15 as well as the resin film 11.

As described previously, with the conventional vapor-deposition mask, there is a problem that the temperature of the substrate to be vapor-deposited 2 and the vapor-deposition mask 1 at the periphery of the frame 15 (see FIG. 2) tends to rise and that there is a limit to upsizing since the weight of the vapor-deposition mask 1 dramatically increases with upsizing. In other words, as described later, at the time of vapor deposition, the vapor-deposited material is caused to fly away from the vapor-deposition source (see FIG. 2) to the vapor-deposition mask 1. Therefore, the vapor-deposition source 5 is very high in temperature and a portion of the frame 15 that is closest to the vapor-deposition source 5 also rises in temperature due to radiative heat. In the vapor-deposition mask 1, the temperature of a portion of the metal supporting layer 12 also rises, which heat thereof is transmitted to the substrate to be vapor-deposited 2. However, as described previously, the temperature increase in the portion of the frame 15 is larger than the temperature increase in the metal supporting layer 12 of the center portion and the thermal capacity of the frame 15 is large because it has substantial weight. In other words, the conventional frame is formed with a solid rod material, so that, once the temperature rises, high temperature is maintained for a long time since the thermal capacity is large. Therefore, when the substrate to be vapor-deposited 2 is replaced and vapor deposition onto another substrate to be vapor-deposited 2 is carried out on completion of vapor deposition onto the substrate to be vapor-deposited 2, the temperature of the frame 15 is high from the outset thereof, so that the substrate to be vapor-deposited 2 in the vicinity thereof is likely to rise in temperature from the time that it is installed. Therefore, there is a problem that the substrate to be vapor-deposited 2 has a large thermal expansion at the peripheral edge thereof and is likely to produce misalignment with a center portion.

Moreover, with upsizing of the vapor-deposition mask, the weight of the frame 15 of the structure shown in FIG. 1A also becomes problematic. In other words, while the mask main body 10 comprising the resin film 11 and the metal supporting layer 12 are joined to the frame 15 as described previously, the mask main body 10 is bonded to the frame 15 with tension applied from the viewpoint of the stability of the shape of the aperture. This tension is, for example, approximately 10N for each sheet of the strip-shaped resin film 11 shown in FIG. 1 and several ten millimeters are needed for each of the width and the thickness of the frame 15. When the vapor-deposition mask 1 of the size of G6H described previously is formed with a rectangular rod material of 50 mm×40 mm, for example, the size of G6H is the size of the substrate and the frame 15 is arranged at the outer periphery thereof, so that the length of each side of the frame 15 is 50 mm larger than the size of G6H. While the frame 15 is rectangular-frame shaped, so that the length of only two long sides of the frame 15 can be made to be long to make the short side of the frame to be the dimension of the substrate size, for example, in which case the long side of the frame needs to be made twice as long as the frame width (approximately 100 mm), the result is the same as extending each side by 50 mm.

Thus, the total volume of the frame 15 is 2×(1550 mm+950 mm)×2000 mm$^2$=10000 cm$^3$. As described previously, the linear expansion coefficient of the material of this frame 15 is preferably close to that of the substrate to be vapor-deposited 2 (see FIG. 2) and glass, or polyimide, whose linear expansion coefficient is close to that of glass, is used as the substrate to be vapor-deposited 2, invar is generally used for the frame 15 or the metal supporting layer 12 of the vapor-deposition mask 1. The relative density of invar is approximately 8, so that the weight thereof is approximately 80 kg. It is aimed that the frame 15 be further capsized relative to G6H, so that it is necessary to make each side of the frame 15 longer, but also to make the width and the thickness of the frame 15 greater, so that the weight thereof becomes greater than the above-mentioned weight. As a result, conveyance thereof by a robot arm becomes impossible.

To solve these problems, the present inventor have made intensive studies to search for a material which has a small linear expansion coefficient, a small thermal conductivity, a large strength, and a small weight, and have found that the CFRP is suitable therefor. This CFRP, as the physical property thereof indicates below, has a small relative density and can be made to be substantially lighter. Moreover, the CFRP can be made further lighter and thermal conduction can be suppressed by having a gap inside thereof and having the end plate 152 bonded to at least a part of the surroundings to form a sandwich structure 150 (see FIG. 1B).

CFRP is a raw material in which plastics (resins) and carbon fibers (broadly-defined carbon fibers including various fiber materials having, as reinforcing fibers, silicon carbide (SiC), a glass fiber, a high-rigidity carbon fiber, a high-strength carbon fiber, besides narrowly-defined normal carbon fibers) are composited. Compositing with plastics makes it possible to demonstrate the raw material characteristics that the carbon fiber has of being strong, light, and slim. The type of the reinforcing fiber can be changed to adjust the value of thermal conductivity and linear expansion coefficient as well as tensile strength, tensile modulus, bending strength, and bending modulus. SiCFRP, with silicon carbide as the reinforcing fiber, having a linear expansion coefficient close to that of polyimide among others, is suitable for a mask frame.

As the characteristics thereof,
(a) the relative density is between 1.5 and 1.7, which is smaller than 2.698 for Al, and is much smaller than 8.05 for invar, which is a magnetic material, 7.87 for Fe, or 8.9 for Ni. In other words, relative to the conventional frame using invar, making the weight approximately ⅕ to ¼ in comparison to that of another solid material can be achieved.
(b) The strength is very high. In other words, it is between 700 to 3300 MPa, which is larger than 500 for Al and is equivalent to 1000 for Fe.
(c) The rigidity is between 55 and 550 GPa, which is comparable to 80 for Al, or 200 for Fe, and can be made to be more than or equal to 80 for Al, or 200 for Fe.
(d) Moreover, the linear expansion coefficient is 3 ppm/° C., and can also be made to 0 by controlling the type or direction of the fiber. It is −0.4 to +1.5 ppm/° C. for carbon fiber, +50 ppm/° C. for resin, and +1.5 to +4.9 ppm/° C. for invar.

While the thermal conductivity is approximately 7-800 W/(m·° C.), which greatly differs depending on the type or direction of fiber, there are many materials whose thermal conductivity is greater than 0.2 W/(m·° C.) for resin by at least one order of magnitude and greater than even 13 W/(m·° C.) for invar. While a great thermal conductivity can represent an aspect that the temperature which rose on the vapor-deposition source 5 side of the frame 15 is likely to be transferred to the substrate to be vapor-deposited 2 side, the part of this frame 15 is held by a mask holder 19, and a material with good thermal conductance such as stainless steel (thermal conductivity: (16.7 to 20.9) W/(m·° C.)) or aluminum (thermal conductivity: (236 W/(m·° C.)), for example, is used for the mask holder 19, so it is more relevant to a heat dissipation effect. As a result, an effect of dissipating heat via the mask holder 19 is greater than heat being transferred to the substrate to be vapor-deposited 2 side via the gap 151a. As a result, together with a reduction in weight that is caused by the gap 151a, the thermal capacity is reduced, so that heat accumulation can also be overcome.

(f) For a hybrid mask, which is non-magnetic, the metal supporting layer 12 of the mask main body 10 can be formed with a magnetic material such as invar or nickel or the raw material of a high-definition metal mask can be formed with a magnetic material such as invar to cause adsorption by magnet. Moreover, the end plate 152 comprising a magnetic material can be bonded in the surrounding of the frame 15 comprising CFRP to also cause adsorption by magnet.

(g) With high corrosion resistance, weather resistance, alkali resistance, and acid resistance, there is also an effect of being able to resist repeated cleaning of the vapor-deposition mask 1.

Figure 6A:
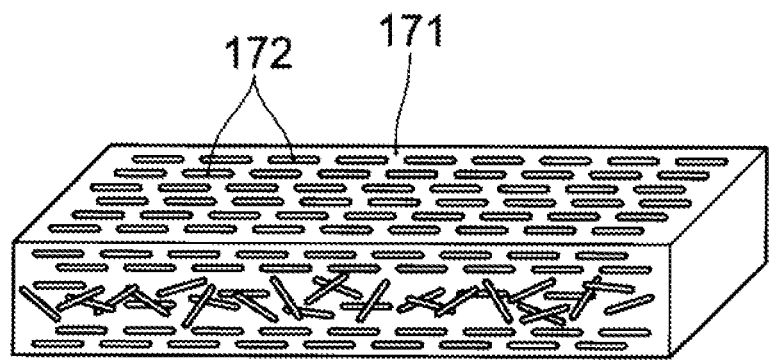
FIG. 6A shows a diagram explaining anisotropy for manufacturing a CFRP material by injection molding.

(h) The anisotropic property can be provided, the mechanical strength can be made different depending on the direction, amount, or position of the carbon fiber, and the mechanical strength in a specific direction can be enhanced. In other words, as shown in FIG. 6A, with an injection-molded article, in general, a melted resin flows in a die, the directions of fillers 172 are aligned in a resin 171, and a high mechanical strength is obtained in that direction. Therefore, a direction in which stress is especially applied is made to be the above-mentioned direction.

As described previously, the CFRP is formed by mixing a broadly-defined carbon fiber into a resin which is a mother material (a matrix). As described previously, various materials can be used for the carbon fiber. For example, a high-strength carbon fiber (linear expansion coefficient: 0.2 to 0.4 ppm/° C.), a high-rigidity carbon fiber (linear expansion coefficient: −0.8 ppm/° C.), or silicon carbide (linear expansion coefficient: 2.6 ppm/° C.) is preferable for having a linear expansion coefficient which is small and which is close to that for the substrate to be vapor-deposited. Moreover, for these CFRPs, the tensile strength is large at approximately 150 kgf/mm². While a thermosetting resin or a thermoplastic resin can be used as the resin, the resin is preferably a thermosetting polyimide resin for the frame 15 of the vapor-deposition mask 1. This is because a polyimide film can be used for the substrate to be vapor-deposited 2 or the resin film 11 of the mask main body 10. The use of this thermosetting polyimide makes it not possible to bend and exceeding the limit causes brittle fractures. However, the use of this thermosetting polyimide is preferable since, with the thermosetting polyimide, it is difficult for deflection to occur. While this material cannot be subjected to welding as it is, a metal film can be formed by electroless plating, electrolytic plating, sputtering, or vacuum evaporation, for example, to weld this material. Moreover, this material can also be joined to a different type of material by a polyimide adhesive, or by mechanical joining using bolts and nuts, so that a metal plate can be bonded onto this material. Moreover, while the heat-resistant temperature is limited by this mother material, a polyimide can resist up to the heat-resistant temperature of approximately 500° C. Furthermore, for making a sandwich structure by molding, at least one of the end plates 152 can also be integrally formed with the core portion 151.

As described previously, these materials can be used to make the weight approximately ¼ or below in comparison to that of invar even in a solid state since the relative density is very small. However, even when the honeycomb structure-like core portion 151 comprising a thin-walled portion 151b and a gap 151a is made to be the sandwich structure using the end plate 152, a sufficient mechanical strength can be obtained and the weight can be further made to approximately ⅕. As a result, compared to a conventional solid material using invar, a total weight reduction to approximately 1/20 can be achieved. In this case, as the core portion 151 cannot be subjected to welding as it is as described previously, it can be adhered to by a polyimide adhesive, or the surface thereof can be coated with a metal film to weld the core portion 151. The core portion 151 is made to be the sandwich structure 150 to be lightweight. This core portion 151 can be formed by forming a die of such a structure and pouring a mother material mixed with a carbon fiber into the die. Moreover, the gap 151a can be formed at a solid material by mechanical processing. As described later, it is preferable that the core portion 151 and the end plate 152 be bonded under a vacuum atmosphere or a rare gas atmosphere.

The entirety of the core portion 151 can be plated using nickel plating, for example, before bonding this end plate 152, to not only prevent a gas seeping out from the material itself of the core portion 151, but also to join, by welding such as laser welding, with the end plate 152 or the below-described mask main body 10. Moreover, for forming the core portion 151 by molding using a die, the core portion 151 can be integrally formed with one of the end plates 152. Moreover, for the below-described corrugated structure shown in FIG. 3B, the end plates 162 below and above thereof can be integrally molded with a wave plate 161b, and, on a side surface thereof, the end plate 162 can be bonded thereto. Besides integrally forming some of the end plates 152 and 162 with the core portions 151 and 161, the end plates 152 and 162 can be formed with CFRP and bonded to the core portions 151 and 161 with a polyimide adhesive. Alternatively, the previously-described metal film can be formed, by plating, on a surface of a plate-shaped body comprising a CFRP to make it possible to weld with the mask main body 10 or the core portions 151 and 161.

The above-described CFRP material has a tensile strength of 150 kgf/mm² and a tensile elasticity of 15000 kgf/mm² while invar has a tensile strength of 59.7 kgf/mm² and a tensile elasticity of 12700 kgf/mm², so that the above-described CFRP material is higher in strength than the conventional invar at the time of shipment in bulk. As described previously, the above-described CFRP material can be used to make the weight approximately ¼ and a sandwich structure can be formed to reduce the weight to approximately 1/20. As a result, a vapor-deposition mask can be used with a robot arm which is downsized compared to a conventional robot arm.

(Structure of Vapor-Deposition Mask)

Figure 1B:
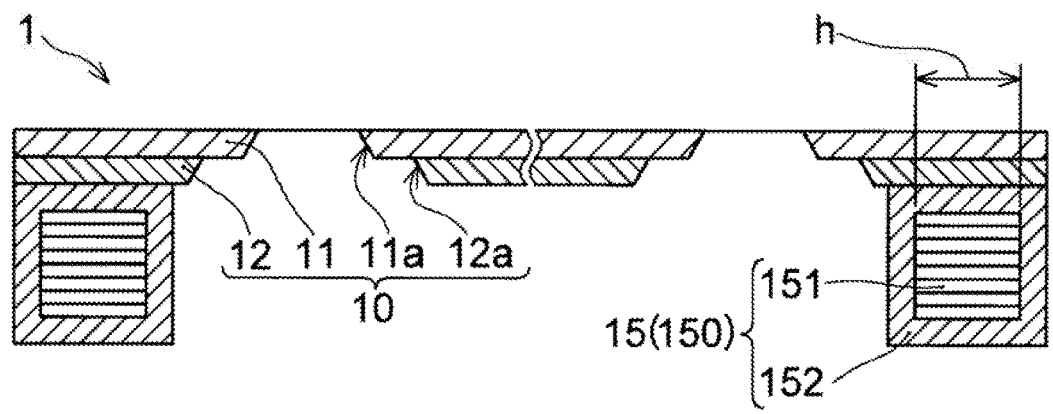
FIG. 1B shows a cross-sectional view taken along a line B-B in FIG. 1A.
Figure 1C:
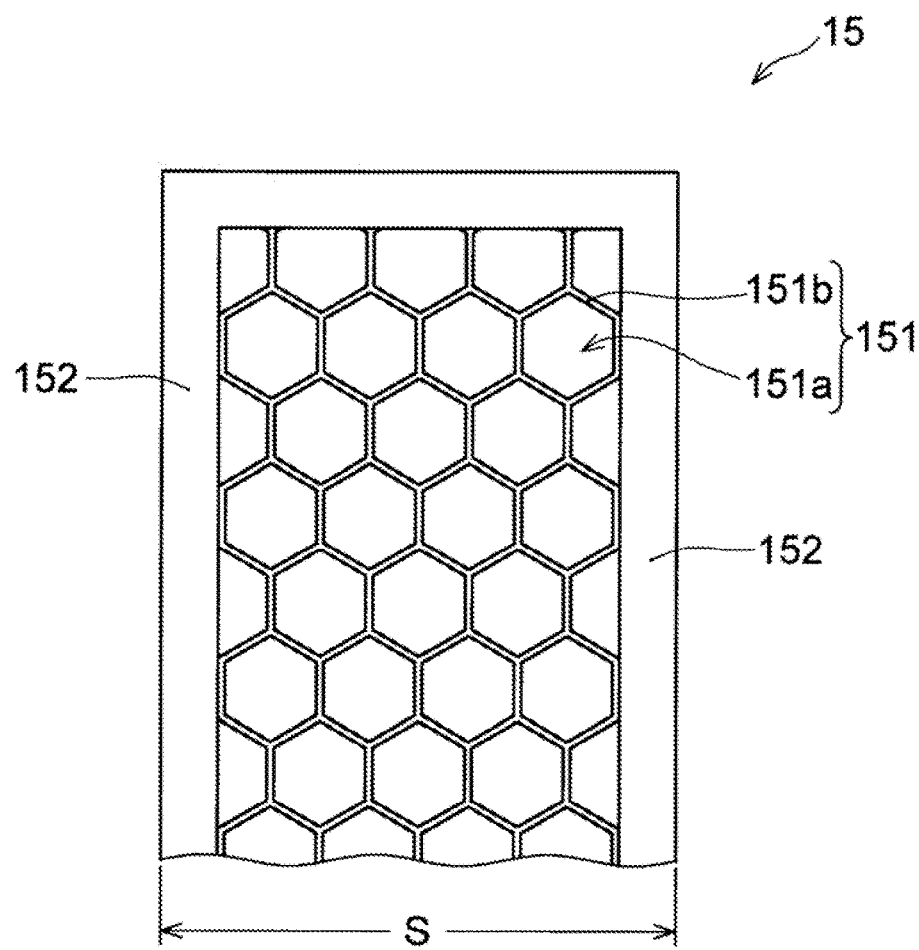
FIG. 1C shows a view as seen from an arrow C in FIG. 1A.
Figure 5:
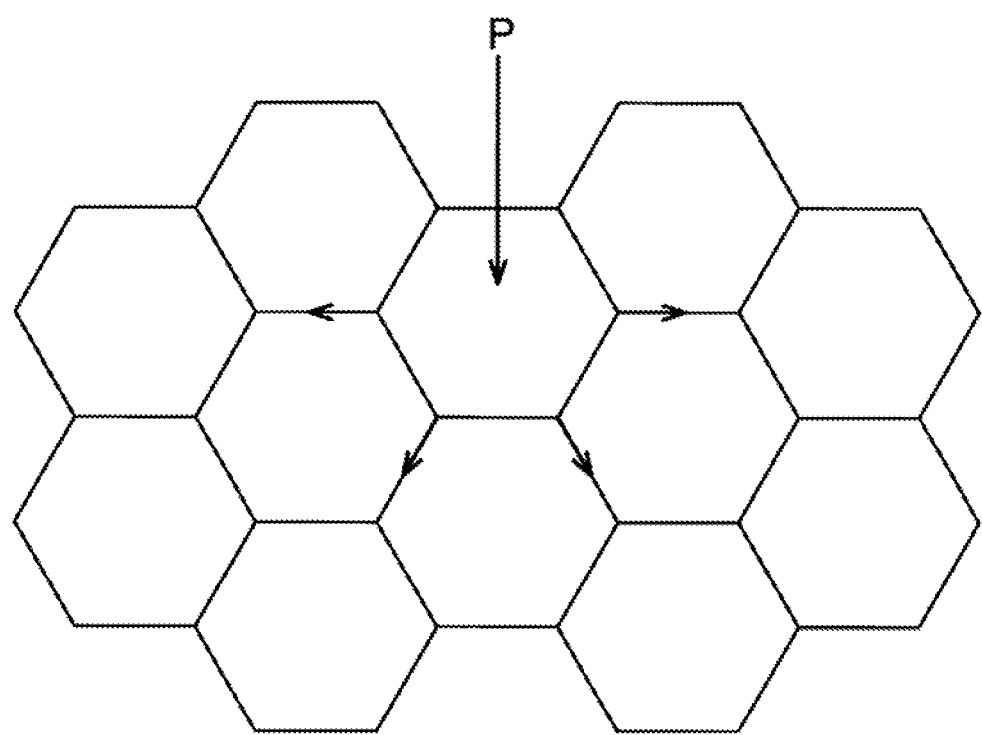
FIG. 5 shows a diagram explaining a reason that a honeycomb structure is strong even against a force in the horizontal direction.

More specifically, as shown in FIG. 1C with a side view as seen from an arrow C in FIG. 1A, the frame 15 has a through hole (gap) 151a formed and the through hole 151a is formed to have a hexagonal shape. In this case, the frame 15 is injection molded such that the previously-described carbon fiber fillers are aligned in the direction of this through hole 151a to realize a further increased buckling stress. The through hole 151a is formed in such a hexagonal honeycomb structure, so that it is very strong against not only stress in an axial direction of the through hole 151a, but also against stress in a direction perpendicular to the aperture of the through hole 151a. The reason is that, as shown in a schematic diagram of the honeycomb structure in FIG. 5, for example, when a stress P in the horizontal direction is applied against the through hole 151a, stress is uniformly shared to each side of the hexagonal. Thus, the through hole 151a is very strong even with respect to the stress P in the horizontal direction and a strength thereof is twice to three times that of a solid material with respect to stress per unit mass. Conversely, the weight thereof can be reduced to ⅙ to ¼ to maintain the same stress. Moreover, the material is the same, so that physical constants such as the linear expansion coefficient and the tensile strength do not change. Furthermore, the presence of the gap (through hole 151a) makes the volume of the part of the thin-walled portion 151b to be reduced, causing the thermal capacity to be reduced. At the time of sticking the end plate 152 as described later, the through hole 151a can be depressurized, or sealed in with a rare gas such as argon to further reduce heat accumulation into the gap.

While the present example is explained using an example of a narrowly-defined honeycomb structure that is regular hexagonal shaped, it is construed that the shape of the gap 151a be not necessarily limited to a regular hexagon, so that, while being somewhat weaker against horizontal stress, it can be an irregular hexagon, a polygon other than a hexagon, or, in extreme cases, a circle. In case of the shape of the gap 151a being circular, a circular hole with a small radius can be made to be inscribed in a region surrounded by four circles to form a thin-walled portion 151b that is thin-walled and has similarly many gaps 151a. In the present specification, a broadly-defined honeycomb structure including these structures is called a honeycomb structure. Moreover, it is construed that the present embodiment be not limited to such a honeycomb structure, so that, even with a corrugated structure shown in FIGS. 3A to 3B, the orientation thereof is set such that an axial direction of the through hole (the gap) 161a is oriented to the direction in which stress is applied to cause a frame 15 that is similarly lightweight and large in mechanical strength to be formed.

Figure 3A:
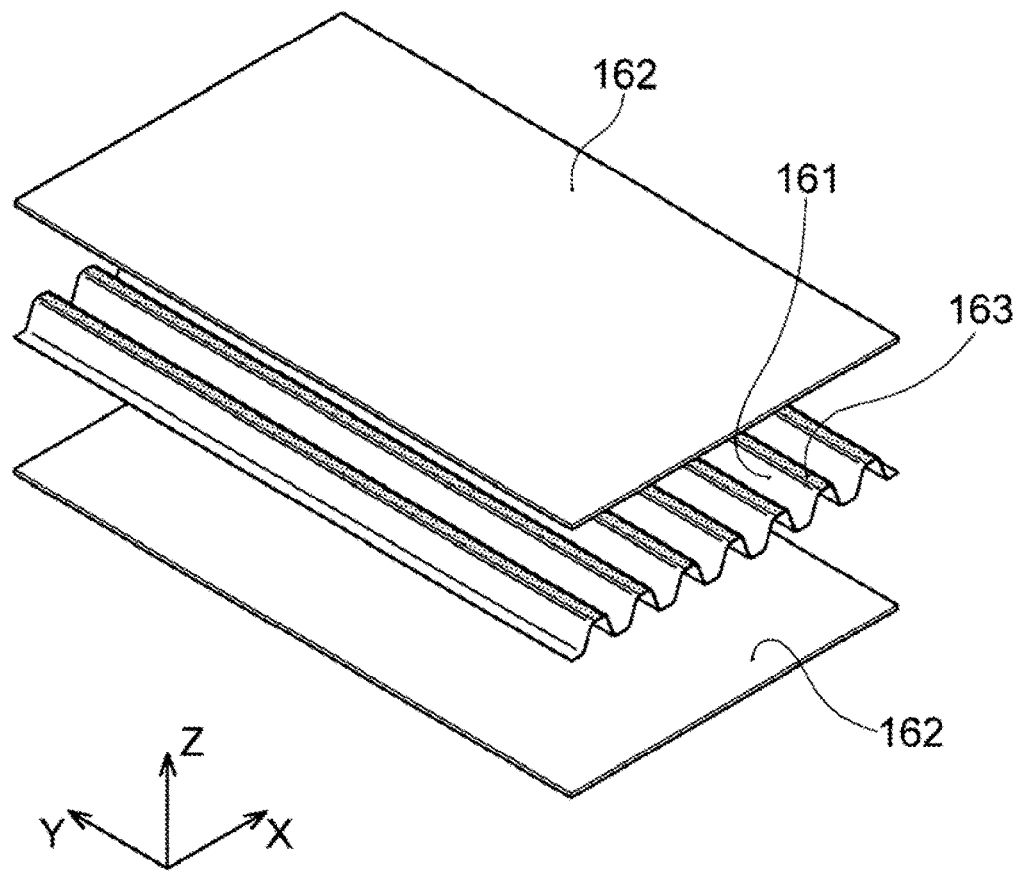
FIG. 3A shows an exemplary structure of a frame in FIG. 1A.
Figure 3B:
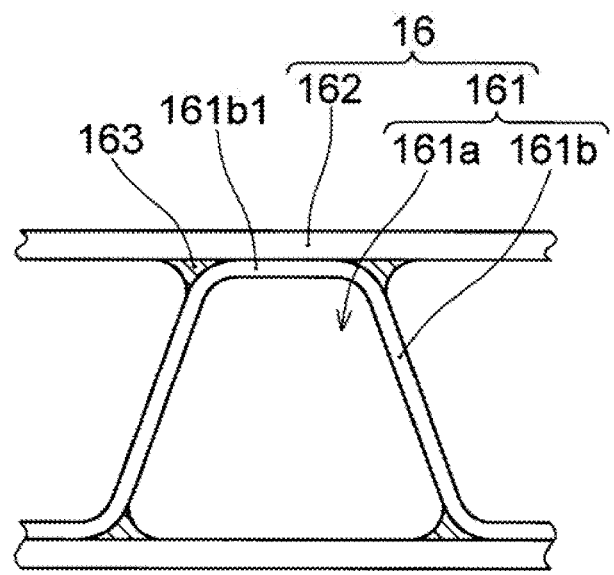
FIG. 3B shows an enlarged view of a connection portion between a core and an end plate in FIG. 3A.

In the structure shown in FIG. 3A, a wave plate 161b in which the core portion 161 is shaped to have a wave shape is formed. The end plates 162 are integrally formed outside peak and valley portion of the wave plate 161b thereof or they are bonded to the peak and valley portion of the wave plate 161b thereafter to form a sandwich structure 16. While this structure is somewhat weak with respect to a force in the left-right horizontal direction (x-axis direction) in FIG. 3A, it is strong with respect to stress in the axial direction (y-axis direction) in FIG. 3A and also strong with respect to stress in the z-axis direction. In this case, as shown in FIG. 3B, the wave plate 161b and the end plate 162 are firmly adhered, or a wall stopping portion is formed, at the time of molding, at a portion joining the wave plate 161b and the end plate 162 to cause a large mechanical strength to be obtained. Thus, preferably, a peak and valley portion 161b1 of the waveform of the wave plate 161b is made somewhat planar to provide the joining portion using an adhesive 163 or the wall-stopping portion. While the end plate 162 is provided on upper and lower surfaces in the example shown in FIG. 3A, it is preferable that the surrounding of side surfaces be covered with the end plate 162.

The core portion 151 of the sandwich structure having the previously-described honeycomb structure can be formed by integrally molding with one of the end plates 152 by a die as described above. As shown with a plan view thereof in FIG. 6B, the thickness d of the thin-walled portion 151b is formed to a thickness of approximately 1 mm and, as described previously, the lower end plate 152 can be integrally molded with the core portion 151. A large core portion 151 can be formed using molding with a die and, thereafter, can be cut to a necessary width t. The height h of the through hole 151a (the height h of the core portion 151 of the honeycomb structure for the frame 15 formed with the structure shown in FIG. 1A) (see FIG. 1B)) is formed to approximately 20 mm to 50 mm. The core portion 151 can be cut in accordance with the height h after forming a large-sized honeycomb structure using injection molding. The end plate 152 on the upper surface in FIG. 6C can be bonded by an adhesive such as a polyimide adhesive, for example.

Figure 6B:
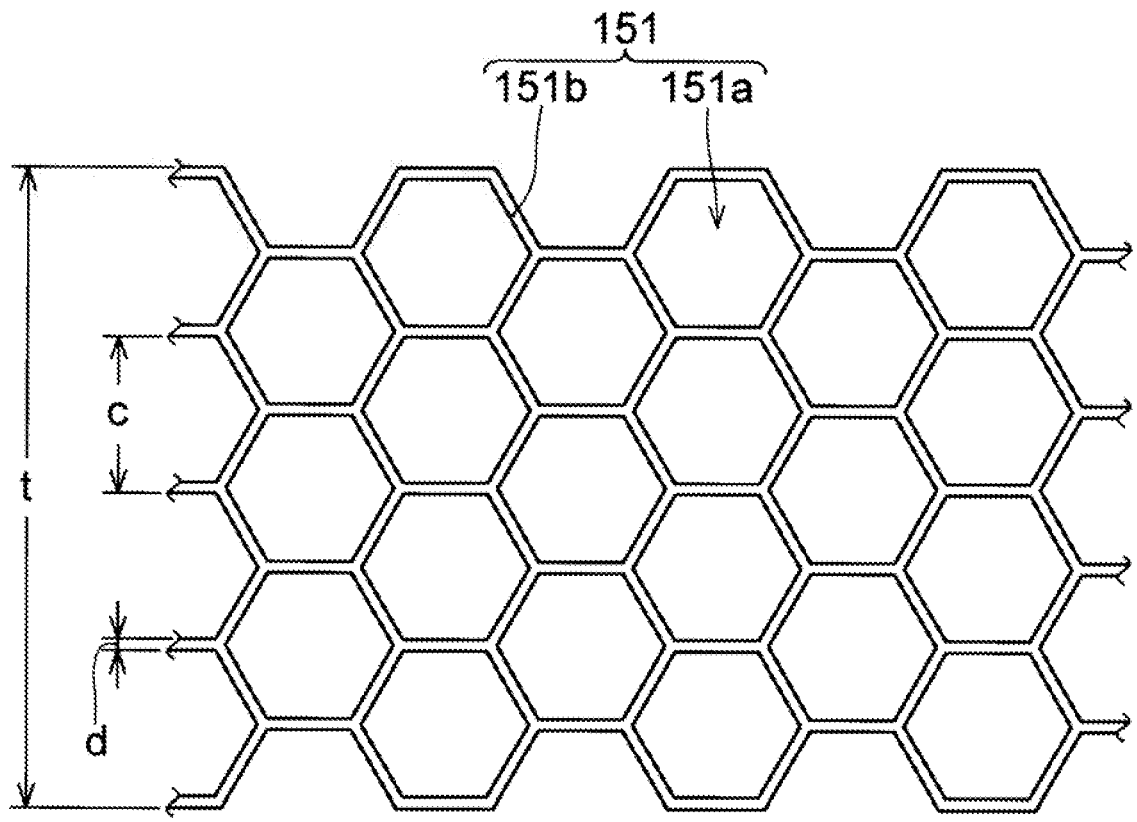
FIG. 6B shows a plan view of one example of a diagram explaining a honeycomb structure.
Figure 6C:
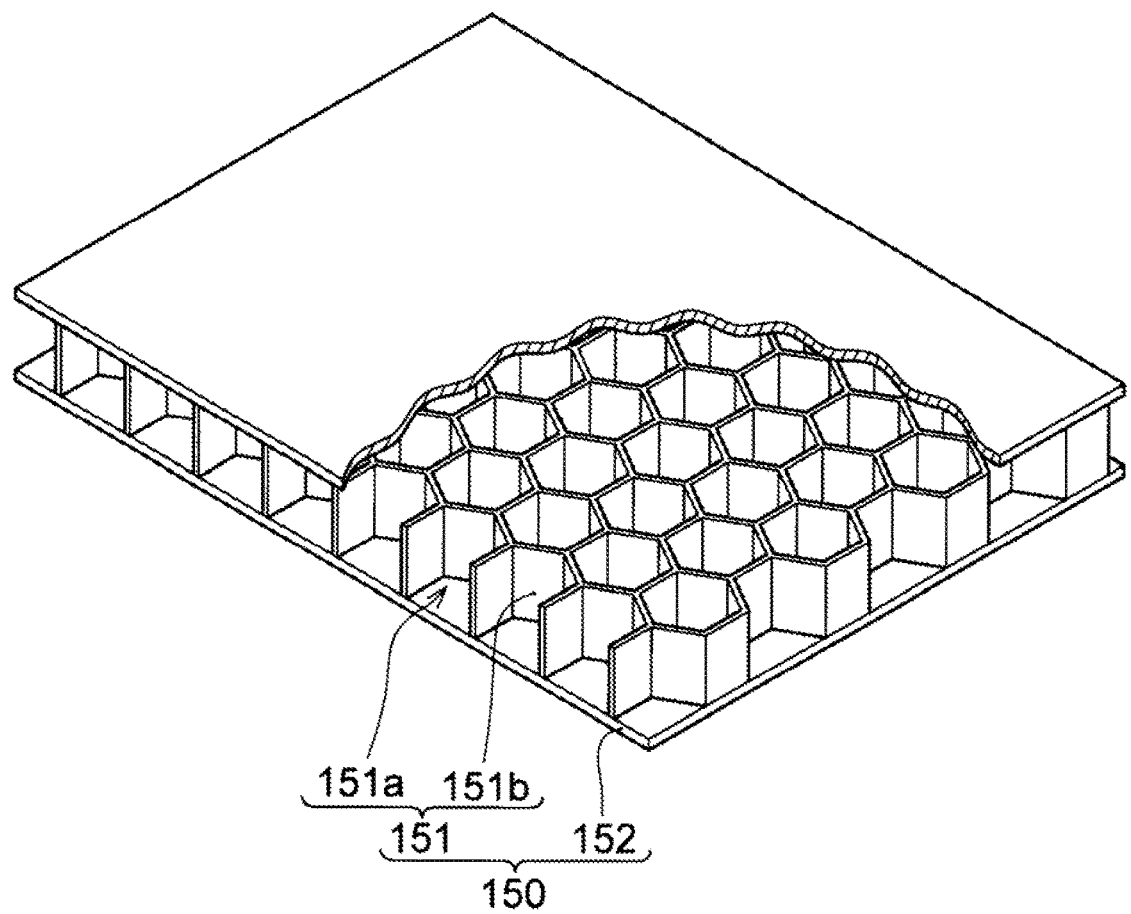
FIG. 6C shows a perspective view of a core portion in FIG. 6B.

In this example, the cell size c shown in FIG. 6B is formed to approximately 5 to 10 mm. The perspective view in this state is shown in FIG. 6C. A columnar-shaped body with a rectangular cross section that has the previously-described height h and a length (width of the frame) s (see FIG. 1C) in which twice the thickness of the below-described end plate 152 is added to the width t of the core portion 151 in FIG. 6B is formed. Each of the width s and the height h is formed to approximately several ten mms, and the length is set in accordance with the magnitude of the vapor-deposition mask 1. However, this is one example, so that these dimensions can be arbitrarily set depending on which orientation of the frame that the through hole is to be arranged in.

It is construed that the thickness d of the thin-walled portion 151b used in the previously-described example be also not limited thereto, so that it is selected as a thickness which can resist the necessary load. For example, to be able to resist a large load, for example, the plate thickness d of the thin-walled portion 151b can be increased. Moreover, with this structure, a forming a through hole 151a at a plate-shaped body instead of molding using a die can be used. Therefore, a sandwich structure 150 comprising a gap having different structures can be formed.

The sandwich structure 150 comprising a honeycomb structure has the features that it is strong with respect to in-plane/out-of-plane shear load and out-of-plane compression load and that it has a high out-of-plane rigidity (a high buckling strength). Stress is made to apply in the maximum-strength direction, so that advantages (i.e., lightweight and highly rigid) of the honeycomb structure are utilized. Using the thickness d shown in FIG. 6B and the cell size shown in FIG. 6B, the higher the value of d/c, the higher the rigidity, so that, when the rigidity is to be increased, the plate thickness d of the thin-walled portion 151b can be increased and the cell size c can be decreased to easily obtain a desired rigidity.

While the core portion 151 thus formed can be used as a highly-rigid material as it is, the periphery thereof, as shown in FIG. 1C, can be surrounded by the end plate 152 to make a sandwich structure 150 to further increase the rigidity. For the end plate 152, an invar plate having a thickness of approximately 3 mm is used, for example. In FIG. 1C, for ease of understanding of the internal structure, the end plate 152 that closes the gap (through hole) 151a is not shown. While the end plate 152 can be bonded for each surface of a quadrangular prism, as described previously, the end plate 152 facing the through hole 151a can be integrally formed with the core portion 151, or, alternatively, only the core portion 151 is molded and one or two plate materials are bonded to the core portion 151 by bending the one or two plate materials such that they surround the four sides of the core portion 151, the latter being stronger with respect to rigidity in all directions. Even when one of the end plates 152 is integrally molded with the core portion 151, an end plate 152 comprising a metal plate can further be bonded thereon. It can be convenient for magnetic adsorption. The use as a frame 15 of the vapor-deposition mask 1 is also preferable from a point of view of not only rigidity, but also from a point of view of suppression of an organic material penetrating into the gap 151a. In other words, this is because, at the time of vapor deposition, the organic material floats in a vacuum chamber and is also likely to seep into the gap 151a. Moreover, with respect to the vapor-deposition mask 1, when a certain number of vapor depositions are carried out, it is necessary to remove the organic material adhered to the vapor-deposition mask 1, so that the vapor-deposition mask 1 is cleaned periodically. At the time of this cleaning, the cleaning agent can also get into the gap 151*a* and can remain in the gap 151*a* even after cleaning. Vapor deposition is carried out with this vapor-deposition mask 1 being installed within the vacuum chamber, so that, if the cleaning agent remains in the gap at the time of making the chamber vacuum, the remained cleaning agent is caused to be a gas source, making it not possible to carry out normal vapor deposition.

Therefore, it is preferable that this gap 151*a* be sealed hermetically with the end plate 152. Unevenness are present not only on an aperture surface of the gap (through hole) 151*a*, but also on the side surface (a side surface which is parallel with the through hole 152), it is preferable for the same reason that the end plate 152 is bonded thereon. This end plate 152 can be bonded using a polyimide adhesive. While a firm connection can be made at a portion at which the end plate 152 can adhere onto a portion of a surface of the core portion 151 in the upper and lower surfaces shown in FIG. 6B, a contact area between the core portion 151 and the end plate 152 is small in the aperture surface of the gap 151*a* and left and right surfaces in FIG. 6B, so that sufficient adhesive is needed. However, as described previously, instead of the end plates 152 being separately bonded onto each side surface, one metal plate is bent and bonded, causing an increased strength against stress and also an increased strength of adhering onto the core portion 151. As a result, as described previously, it is preferable that all of six sides of the quadrangular prism be surrounded by the end plate 152.

The rod-shaped sandwich structure 150 thus formed is prepared in accordance with the length of a long-side vertical frame 15*a* and a short-side horizontal frame 15*b* of the vapor-deposition mask 1 to manufacture the frame body of the frame 15 and ends of the rod-shaped sandwich structure 150 are joined to manufacture the frame body of the frame 15. While this rod-shaped sandwich structure 150 is conventionally joined using a bolt, in the present embodiment, there are many gaps, so that sufficient fixing is required such that torsion does not occur. Therefore, it is preferable that assembling be carried out by having a splint applied to a corner portion of a frame-like quadrilateral, passed through the sandwich structure 150, and fastened with bolts and nuts. Joining of the corner portion is sufficiently carried out, making occurrence of torsion difficult.

While the gap (through hole) 151*a* is preferably closed by the end plate 152 as described previously, it is more preferable that the interior of the gap 151*a* be brought to negative pressure (be depressurized) by bonding the end plate 152 under reduced pressure at the time of closing the gap 151*a*. This is because, as the vapor-deposition mask 1 is used in a vacuum evaporation apparatus as described previously, air trapped within the gap 151*a* in the vacuum chamber can leak in case the interior of the gap 151*a* is sealed at one atmospheric pressure, thus causing the degree of vacuum within the vacuum chamber to be reduced. The interior of the gap 151*a* being brought to negative pressure also reduces heat accumulation at the gap, and, moreover, heat conduction to the mask holder 19 of the frame 15 heated by the vapor-deposition source 5 (see FIG. 2) can further be promoted.

From the point of view of suppressing heat conduction to the substrate to be vapor-deposited 2 side, a rare gas such as argon can be sealed into the gap 151*a* to further suppress heat conduction to the substrate to be vapor-deposited 2 side and promote heat conduction to the mask holder 19 side. This is because the rare gas has a low thermal conductivity.

To seal in the rare gas or depressurize within the gap 151*a* as such, the core portion 151 and the end plate 152 can be joined under the depressurized atmosphere and/or under the rare gas atmosphere.

In the example shown in FIG. 1A, with respect to the portion of the vertical frame 15*a* of the frame 15 that corresponds to the long side of the rectangular-shaped vapor-deposition mask 1, the core portion 151 is formed such that the gap (through hole) 151*a* faces outward from the center portion within the plane of the vapor-deposition mask 1. Thus, as shown in FIG. 1B with the cross-sectional view taken along the line B-B in FIG. 1A, the through hole (gap) 151*a* extends in the horizontal direction and, as shown in FIG. 1C with the view as seen from the arrow C in FIG. 1A (the view in which the end plate 152 is removed), the planar shape of the gap 151*a* appears as it is.

The sandwich structure 150 comprising such a gap 151*a* is particularly strong against load in the direction parallel to the axis of the gap 151*a*. On the other hand, as described previously, as the vapor-deposition mask 1 firmly stabilizes the aperture 11*a* of the resin film 11, the mask main body 10 (see FIG. 1B) comprising the resin film 11 and the metal supporting layer 12 are joined to the frame 15 such that it is pulled to apply tension (see FIG. 1B). There are various methods of bonding this mask main body 10 to the frame 15. While only five sheets of strip-shaped mask main body 10 are shown in the example shown in FIG. 1A, in actuality, in an example in which approximately 12 sheets are bonded successively, the mask main body 10 is pulled along the short-side horizontal frame 15*b* of the strip-shaped frame 15 and joined, by welding, to the long-side vertical frame 15*a*. Thus, the long-side vertical frame 15*a* is formed such that the gap 151*a* faces toward the outside (left-right in FIG. 1A) from the center portion of the vapor-deposition mask 1 in the direction in which the above-mentioned tension is applied, or, in other words, in the direction in which the short-side horizontal frame 15*b* extends. In a case that there is no metal supporting layer 12, the mask main body 10 can be directly adhered onto the resin film 11 using an adhesive. In this case, an adhesive which does not produce gas at the time of vapor deposition is used. For example, as an adhesive, a completely curing adhesive such as a polyimide resin or a thermosetting epoxy resin is preferable.

Figure 4:
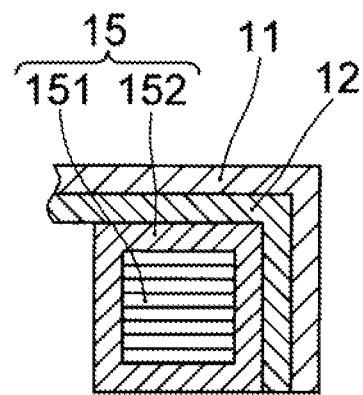
FIG. 4 shows another exemplary structure of joining of a mask main body and the frame.

When welding this strip-shaped mask main body 10 to the frame 15, having a long end portion of the mask main body 10 joined to the outer surface of the frame 15 that is opposite the center portion of the mask main body 10, or an outer peripheral wall opposite to the inner surface of the frame 15, as shown in FIG. 4, further makes it strong against stress due to tension. In this case, welding is carried from the right-side surface in FIG. 4. In particular, there is a great advantageous effect when bonding is carried out with an adhesive onto only the resin film 11 and there is no metal supporting layer 12.

Figure 2:
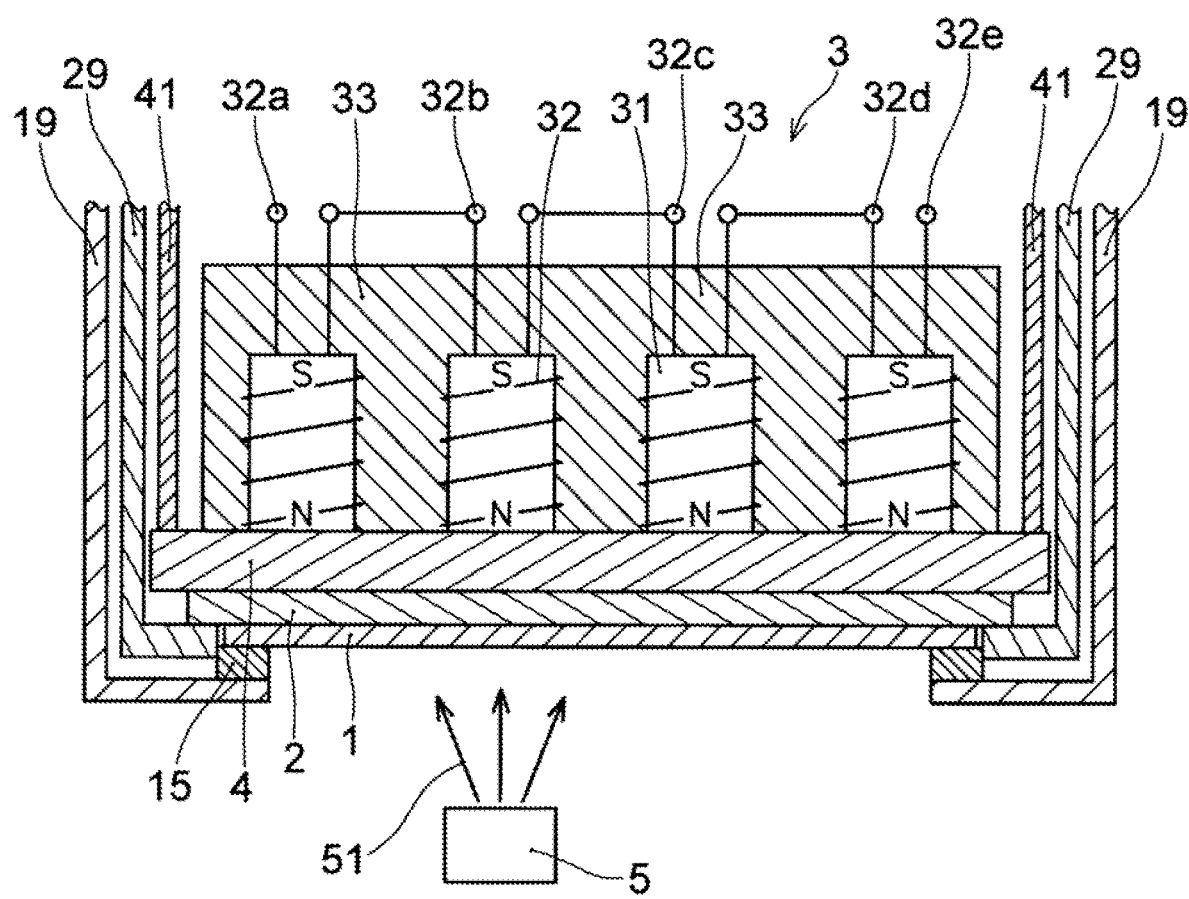
FIG. 2 shows a schematic side view of a vapor-deposition apparatus.

With respect to the short-side horizontal frame 15*b* of the frame 15, substantial weight of the vapor-deposition mask 1 is exerted onto the lower side when the vapor-deposition mask 1 is positioned upright (it can be not all the weight since the vapor-deposition mask 1 can be arranged in a slanting position, not being positioned vertically upright) in a case that this vapor-deposition mask 1 is arranged vertically (arranged such that the upper/lower relationship shown in FIG. 2 is set to be in the horizontal direction) to set the vapor-deposition mask 1 to be a vertical-type vapor-deposition apparatus, the short-side horizontal frame 15*b* is also formed such that the gap 151*a* faces externally within the plane from the center of the vapor-deposition mask 1. In this case, mutually pulling forces are applied to opposing two long-side vertical frames 15a, so that it is necessary that large load be tolerated also in the length direction of the short-side horizontal frame 15b. In the above-described example, the length direction of the short-side horizontal frame 15b corresponds to the horizontal direction of the core portion 151, so that the strength against load in the length direction of the horizontal frame 15b can be less than the strength against load in the direction perpendicular to the aperture surface of the gap 151a. However, as described above, the regular-hexagonal honeycomb structure can sufficiently tolerate a force which is evenly distributed to each side of the hexagon even for load from the horizontal direction. Moreover, the mask main body 10 of the vapor-deposition mask 1 can be bonded not in a strip shape, with a large quadrilateral mask being pulled in four directions, in which case, in the same manner as a case of the previously-described long-side vertical frame 15a, the orientation of the core portion 151 is preferably arranged such that the gap 151a faces the direction perpendicular to the side. Therefore, the orientation of the honeycomb structure of the long-side vertical frame 15a and the orientation of the honeycomb structure of the short-side vertical frame 15b are set to be different. In other words, the vapor-deposition mask 1 features that the orientation of the gap 151a of the sandwich structure is different between the long-side vertical frame 15a and the short-side horizontal frame 15b. However, depending on the arrangement of the vapor-deposition mask 1, the orientation of the gap of each side of the vapor-deposition mask 1 can be adjusted as needed.

As shown with a cross-sectional view thereof in FIG. 1B, the mask main body 10 of the vapor-deposition mask 1 comprises the resin film 11, and the metal supporting layer 12, for which a magnetic material is used. As the metal supporting later 12, Fe, Co, Ni, Mn, or an alloy thereof, for example, can be used. Among them, invar (an alloy of Fe and Ni) is particularly preferable since the difference in the linear expansion rate relative to the substrate to be vapor-deposited 2 is small and there is almost no expansion due to heat. The thickness of the metal supporting layer 12 is formed to approximately 5-30 μm.

In FIG. 1B, the aperture 11a of the resin film 11 and the aperture 12a of the metal supporting layer 12 are formed in a tapered shape such that they are tapered toward the substrate to be vapor-deposited 2. The reason is to prevent them, when the vapor-deposition material 51 (see FIG. 2) is vapor-deposited, from being shadows of the flown-away vapor-deposition material 51. It is construed that the mask main body 10 be not limited to a hybrid mask, so that it can be a metal mask or a mask comprising only a resin film.

When the mask main body 10 is a metal mask, an aperture pattern is formed using an invar sheet whose thickness is approximately 30 μm, for example. Adjusting conditions of etching processing, the aperture pattern is formed such that it is shaped in a tapered shape toward the substrate to be vapor-deposited 2. As shown in FIG. 1A, for example, such a mask main body can be bonded in a plurality of sheets inn a strip shape, or can be bonded as one sheet. This metal mask is also bonded onto the frame by welding with tension being applied to the metal mask. While the metal mask can be curled, so that it is necessary to apply more tension to the metal mask than to the resin mask, the frame according to the present embodiment is very strong, so the advantageous effect is greater when the frame according to the present embodiment is used for the metal mask than for the resin film mask.

Such a mask main body 10 can be bonded onto the previously-described frame-shaped frame 15 to obtain a vapor-deposition mask 1. While the above-described vapor-deposition mask 1 has a structure that the metal supporting layer 12 is bonded onto the resin film 11, it can be without the metal supporting layer 12. In a case that there is no metal supporting layer 12, a further stability of the resin film 11 is required, so that the mask main body 10 needs to be fixed to a sturdy, strong frame 15. While the frame 15 is likely to be heavy as a result, the frame 15 can be made to be the sandwich structure 150 comprising the above-described gap 151a to prevent the weight from increasing. In a case that the metal supporting layer 12 is not provided, a magnetic body can be used for the frame 15 of the vapor-deposition mask 1 to allow adsorption with a magnet.

The frame 15 of the vapor-deposition mask 1 can be made to be a sandwich structure 150 comprising such a gap 151a to greatly reduce the weight. In other words, while the frame 15 is made to be a honeycomb structure having a structure shown in the previously-described FIG. 6D to reduce the weight of the vapor-deposition mask 1 of G6H to approximately $\frac{1}{20}$ of a conventional solid invar case, there is no problem with stress due to bonding of the mask main body 10. As a result, the vapor-deposition mask 1 having a weight approximately 3 to 4 times the above, or in other words, having a size of G8 (approximately 2200 mm×approximately 2400 mm) or more can sufficiently be conveyed with a robot arm. Even when conveying the vapor-deposition mask 1 with the robot arm becomes possible, space is necessary with a horizontal-type vapor-deposition apparatus 1, and a very large space is necessary since, particularly in manufacturing an organic-EL display apparatus, 6 to 10 vacuum chambers are lined up to carry out vapor deposition while successively replacing the substrate to be vapor-deposited 2. Therefore, it is preferable to use a vertical-type vapor-deposition apparatus (the vapor-deposition mask 1 and the substrate to be vapor-deposited 2 are positioned upright to cause the vapor-deposition material to flow away from the horizontal direction) to reduce the ground area of factories.

Moreover, with the vapor-deposition mask according to the present embodiment, the frame 15 comprises a very large number of gaps 151a. Therefore, the thermal capacity is substantially reduced. As a result, heat accumulation is reduced and heat conduction to the newly-replaced substrate to be vapor-deposited 2 is suppressed, making an occurrence of the temperature distribution of the vapor-deposition mask 1 and the substrate to be vapor-deposited 2 unlikely. This make it possible for a higher-definition organic layer pattern to be formed.

According to the vapor-deposition mask 1 of the present embodiment, a substantial reduction in the weight of the frame 15 causes the thermal capacity to be reduced. Therefore, while the temperature is likely to rise, it is conversely likely to fall. In other words, even when the substrate to be vapor-deposited 2 in a large number is successively vapor-deposited onto with an organic material, replacing the substrate to be vapor-deposited 2, heat accumulates in the vapor-deposition mask 1, so that an immediate heating upon the following substrate to be vapor-deposited 2 being arranged does not occur. As a result, a stable vapor deposition can be repeated.

(Schematic Configuration of Vapor-Deposition Apparatus)

As shown in FIG. 2, according to a vapor-deposition apparatus using a vapor-deposition mask 1 according to one embodiment of the present invention, a mask holder 19 and a substrate holder 29 are provided to be moveable upward or downward such that the vapor-deposition mask 1 and the substrate to be vapor-deposited 2 are arranged in proximity in the interior of a vacuum chamber. This substrate holder 29 holds a peripheral edge portion of the substrate to be vapor-deposited 2 with a plurality of hook-shaped arms and connected to a drive apparatus (not shown) such that it can rise upward or fall downward. For replacing the substrate to be vapor-deposited 2, the substrate to be vapor-deposited 2 carried into the vacuum chamber with the robot arm is received with a hook-shaped arm and the substrate holder 29 falls until the substrate to be vapor-deposited 2 comes very close to the vapor-deposition mask 1. Then, an imaging apparatus (not shown) is also provided to carry out alignment. A touch plate 4 is supported by a support frame 41 and is connected via the support frame 41 to a drive apparatus which cause the touch plate 4 to fall until it comes into contact with the substrate to be vapor-deposited 2. The touch plate 4 being made to fall causes the substrate to be vapor-deposited 2 to be planar.

At the time of alignment between the vapor-deposition mask 1 and the substrate to be vapor-deposited 2 according to the first embodiment, the vapor-deposition apparatus also comprises a micro-motion apparatus which relatively moves the substrate to be vapor-deposited 2 with respect to the vapor-deposition mask 1 while imaging an alignment mark formed on each of the vapor-deposition mask 1 and the substrate to be vapor-deposited 2. Alignment is carried out while stopping supplying power to the electromagnet 3 so that the vapor-deposition mask 1 is not unnecessarily adsorbed by the electromagnet 3. Thereafter, the electromagnet 3 being held by a similar holder (not shown) or the touch plate 4 to be lowered to cause current to flow causes the vapor-deposition mask 1 to be suctioned toward the substrate to be vapor-deposited 2.

According to the present embodiment, a structure in which the core portion 151 of the sandwich structure 150 comprising a gap is sandwiched by the end plate 152 is used for the frame 15 of the vapor-deposition mask 1, so that loading or unloading with a robot arm (not shown) can be easily carried out since it is lightweight.

With respect to the electromagnet 3, a plurality of unit electromagnets, each of which a coil 32 is wound to, is fixed to a coating material 33 comprising a resin. In the example shown in FIG. 2, with respect to the plurality of unit electromagnets, terminals 32a to 30e of the coil 32 of each unit electromagnet are formed to be connected in series. However, it is construed that the configuration of the electromagnet 3 be not limited to this example, so that it can be made to various configurations. The shape of the core 31 can be a quadrilateral or a circle. For example, when the size of the vapor-deposition mask 1 is approximately G6 (1500 mm×1800 mm), a unit electromagnet comprising a core 31 with the size of the cross section of the unit electromagnet shown in FIG. 1 of approximately 50 mm square can be arranged such that a plurality of unit electromagnets are lined up in accordance with the size of the vapor-deposition mask 1 as shown in FIG. 2 (In FIG. 2, the horizontal direction is reduced in scale and the number of electromagnets is drawn to be less.) In the example shown in FIG. 2, the coil 32 is connected in series. However, the coil 32 of each unit electromagnet can be connected in parallel. Moreover, a unit of a few pieces can be connected in series. Current can be independently applied to some of the unit electromagnets.

As shown in the previously-described FIG. 1B, the vapor-deposition mask 1 comprises the resin film 11 and the metal supporting layer 12, and the frame 15 formed in the surrounding thereof and, as shown in FIG. 2, with respect to the vapor-deposition mask 1, the frame 15 is placed on the mask holder 19. A magnetic material is used for the metal supporting layer 12 and/or the frame 15 to cause suction force to act with the core 31 of the electromagnet 3 and cause the substrate to be vapor-deposited 2 to be sucked thereto with the substrate to be vapor-deposited 2 placed between the metal supporting layer 12 and/or the frame 15, and the core 31 of the electromagnet 3.

Various vapor-deposition sources 5 such as point-shaped, linear-shaped, or surface-shaped ones can be used. A linear-shaped vapor-deposition source 5 (extending in a direction perpendicular to the paper surface in FIG. 2) in which crucibles are linearly lined up, for example, is scanned from the left end to the right end of the paper surface to cause vapor-deposition to be carried out on the entire surface of the substrate to be vapor-deposited 2. Therefore, the-above described apertures 11a and 12a are formed in a tapered shape to make even the vapor-deposition material 51 arriving from a slanted direction reach the substrate to be vapor-deposited 2 without blocking it as the vapor-deposition material 51 flies away from various directions.

(Vapor-Deposition Method)

Next, a vapor-deposition method according to a second embodiment of the present invention is described. As shown in FIG. 2 described previously, the vapor-deposition method according to the second embodiment of the present invention comprises arranging a substrate to be vapor-deposited 2 and a vapor-deposition mask 1 shown in FIG. 1B, for example, such that they overlap with each other; and causing a vapor-deposition material to fly away from a vapor-deposition source 5 arranged to be positioned apart from the vapor-deposition mask 1 to cause the vapor-deposition material to be deposited on the substrate to be vapor-deposited 2. In other words, the vapor-deposition method according to the second embodiment of the present invention features that a frame 15 of the vapor-deposition mask 1 is formed by a sandwich structure 150 in which a core portion 151 comprising a gap 151a and a thin-walled portion 151b is covered by the end plate 152 as in a honeycomb structure.

Moreover, as described previously, the substrate to be vapor-deposited 2 is overlapped on the vapor-deposition mask 1. Alignment of this substrate to be vapor-deposited 2 and the vapor-deposition mask 1 is carried out as follows: The alignment is carried out by moving the substrate to be vapor-deposited 2 relative to the vapor-deposition mask 1 while observing, with an imaging apparatus, an alignment mark for alignment that is formed on each of the substrate to be vapor-deposited 2 and the vapor-deposition mask 1. In this way, an aperture 11a of the vapor-deposition mask 1 can be made to correspond with a location to be vapor-deposited of the substrate to be vapor-deposited 2 (for example, the pattern of a first electrode 22 of a supporting substrate 21 for a below-described organic-EL display apparatus, for example). The electromagnet 3 is operated after the alignment is carried out. As a result, a strong suction force acts between the electromagnet 3 and the vapor-deposition mask 1, causing the substrate to be vapor-deposited 2 to firmly approach the vapor-deposition mask 1.

Thereafter, as shown in FIG. 2, causing the vapor-deposition material 51 to fly away (to be vaporized or sublimed) from the vapor-deposition source 5 to be positioned apart from the vapor-deposition mask 1 causes the vapor-deposition material 51 to be deposited onto the substrate to be vapor-deposited 2. More specifically, while a linear source in which crucibles are formed such that they are lined up linearly can be used, it is construed to be not limited thereto.

According to the present embodiment, the vapor-deposition mask 1 is lightweight, making it very easy to install the vapor-deposition mask 1 into a vacuum chamber. Moreover, the vapor-deposition mask 1 being lightweight makes carrying with a robot arm easy, making it possible to carry out further capsizing of the vapor-deposition mask 1. In other words, mass production is possible, making it possible to achieve a cost reduction. Moreover, the gap 151a of the frame 15 causes heat conduction to be suppressed and also causes the thermal capacity to be reduced, making it possible to reduce the thermal expansion difference between the substrate to be vapor-deposited 2 and the vapor-deposition mask 1 with heat being accumulated in the vapor-deposition mask 1. As a result, this makes it possible to carry out vapor deposition onto a large-sized substrate to be vapor-deposited and also carry out high-definition vapor deposition.

(Method for Manufacturing an Organic-EL Display Apparatus)

Next, a method for manufacturing an organic-EL display apparatus using the vapor-deposition method according to the above-described embodiment described. Methods for manufacturing other than the vapor-deposition method can be carried out with well-known methods, so that a method of depositing an organic layer using the vapor-deposition method of the present invention is mainly described with reference to FIGS. 7A and 7B.

A method for manufacturing an organic-EL display apparatus according to a third embodiment of the present invention comprises: forming a TFT (not shown), a planarizing film, and a first electrode 22 (for example, an anode) on a supporting substrate 21; overlapping a vapor-deposition mask 1 aligned with the first electrode 22 being directed downward; and, in vapor-depositing a vapor-deposition material 51, forming an organic deposition layer 25 using the previously-described vapor-deposition method. In this way, a second electrode 26 (see FIG. 7B; a cathode) is formed on the organic deposition layer 25.

Figure 7A:
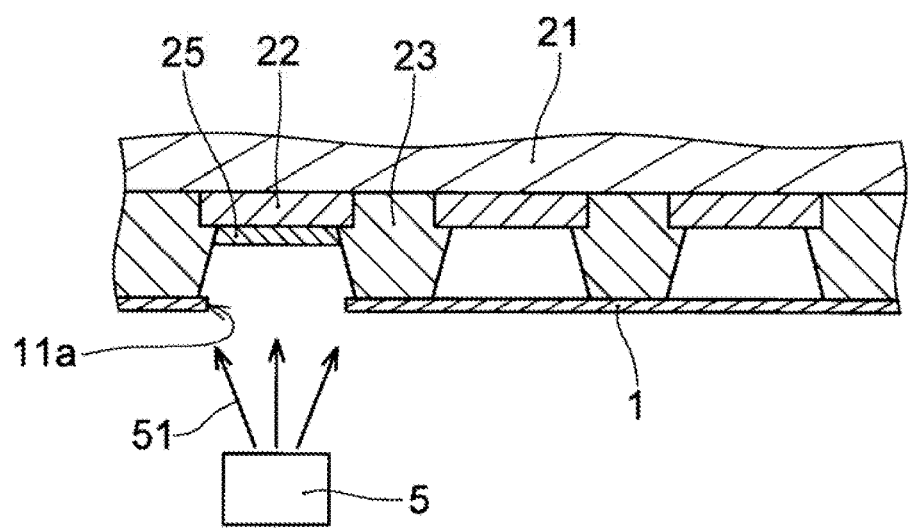
FIG. 7A shows a vapor-deposition process using a method for manufacturing an organic-EL display apparatus according to one embodiment of the present invention.
Figure 7B:
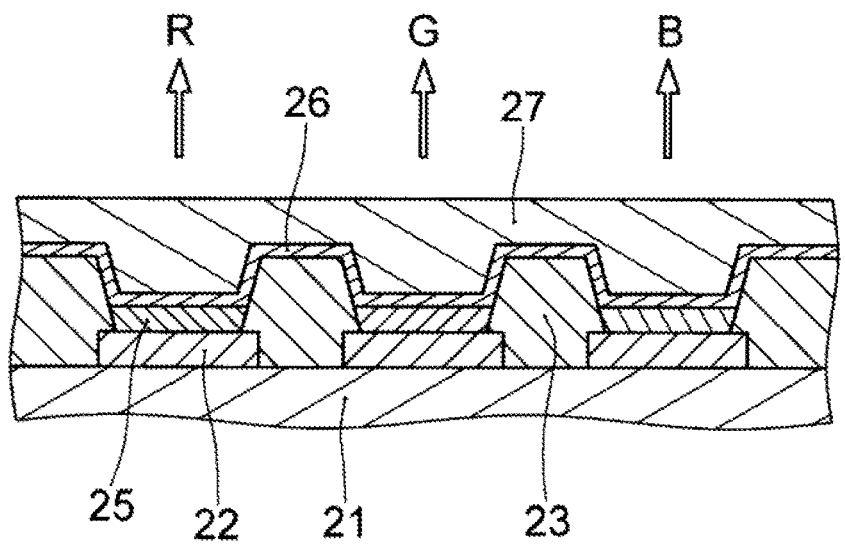
FIG. 7B shows a state in which an organic layer is deposited using the method for manufacturing the organic-EL display apparatus according to one embodiment of the present invention.
Figure 8:
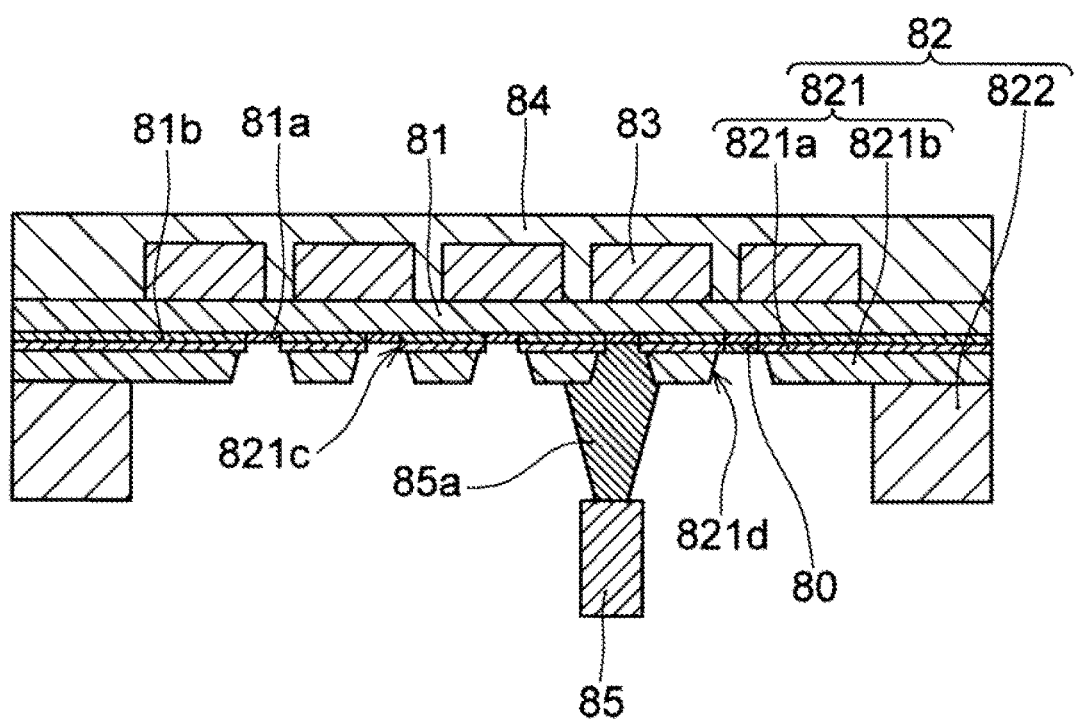
FIG. 8 shows a diagram explaining a conventional case of vapor-depositing an organic layer.

While the supporting substrate 21 such as a glass plate, for example, is not shown fully, a driving element such as a TFT is formed for a RGB sub-pixel of each pixel, and the first electrode 22 that is connected to the above-mentioned driving element is formed on the planarizing film by a combination of an ITO film and a film of metal such as Ag or APC. As shown in FIGS. 7A and 7B, an insulation bank 23 comprising a polyimide resin, an acrylic resin, or $SiO_2$ partitioning sub-pixels is formed in between the sub-pixels. The previously-described vapor-deposition mask 1 is aligned and fixed on the insulation bank 23 of the supporting substrate 21 as such. As shown in FIG. 2 described previously, this fixing is carried out by adsorbing using an electromagnet 3 provided via a touch plate 4 on a surface opposite a vapor-deposition surface of the supporting substrate 21 (the substrate to be vapor-deposited 2), for example. As described previously, a magnetic body is used for the metal supporting layer 12 (see FIG. 1B) of the vapor-deposition mask 1, so that, when a magnetic field is provided by the electromagnet 3, the metal supporting layer 12 of the vapor-deposition mask 1 is magnetized to cause a suction force to be produced with the core 31. Even when the electromagnet 3 does not comprise the core 31, the metal supporting layer 12 is adsorbed by a magnetic field produced by current flowing through the coil 32.

In this state, as shown in FIG. 7A, the vapor-deposition material 51 flies away from a vapor-deposition source (crucible) 5 within a vacuum chamber, the vapor-deposition material 51 is deposited only on a portion of the supporting substrate 21 that is exposed to an aperture 11a of the vapor-deposition mask 1, and the organic deposition layer 25 is formed on the first electrode 22 of a desired sub-pixel. This vapor-deposition process can be carried out for each sub-pixel with the supporting substrate 21 being transferred, in order, to a different vacuum chamber. The vapor-deposition mask 1 with which the same material is simultaneously vapor-deposited for a plurality of sub-pixels can be used. When the vapor-deposition mask 1 is to be replaced, a power supply circuit (not shown) is turned off to cause the magnetic field to the metal supporting layer 12 (see FIG. 1B) of the vapor-deposition mask 1 to be removed by the electromagnet 3 (see FIG. 2) not shown in FIG. 7A.

While the organic deposition layer 25 is simply shown as one layer in FIGS. 7A and 7B, the organic deposition layer 25 can be formed as a plurality of organic deposition layers 25 that comprise different materials. A hole injection layer comprising a material having a good matching ionization energy that improves hole injection property can be provided as a layer in contact with the anode 22, for example. A hole-transport layer that allows electron entrapment into a light-emitting layer (energy barrier as well as improvement in stable transport of holes is formed on this hole injection layer using an amine material, for example. Moreover, a light-emitting layer which is selected in accordance with a light-emitting wavelength is formed thereon with an organic fluorescent material of red or green being doped to $Alq_3$ for red or green, for example. Furthermore, as a blue color material, a DSA organic material is used. An electron-transport layer which, together with improving the electron injection property, transports electrons stably is formed on the light-emitting layer using $Alq_3$. Each of these layers that has a thickness of approximately several ten nm is deposited to form the organic deposition layer 25. An electron injection layer, formed of LiF or Liq, that improves electron injection property can be provided between this organic layer and a metal electrode. In the present embodiment, the organic deposition layer 25 also comprises the above-described layers.

Of the organic deposition layer 25, with respect to the light-emitting layer, an organic layer of a material according to each color of RGB is deposited. Moreover, with respect to the hole-transport layer and the electron-transport layer, it is preferable, with an emphasis on the light-emitting performance, that a material suitable for the light-emitting layer be separately deposited. However, taking into account the aspect of the cost of materials, the same material common to two or three colors of RGB can be deposited. When the material common to sub-pixels of two or more colors is deposited, the vapor-deposition mask 1 is formed in which the aperture 11a is formed for the common sub-pixels. In a case the vapor-deposition layer differs for individual sub-pixels, one vapor-deposition mask for the R sub-pixel, for example, is used to successively vapor-deposit each organic layer. Moreover, when an organic layer common to RGB is deposited, vapor deposition of an organic layer for each sub-pixel is carried out down to the lower side of the above-mentioned common layer, and, at the common organic layer, vapor deposition of the organic layer for all pixels is carried out at once using the vapor-deposition mask 1 at which the aperture 11a is formed for RGB. For mass production, with a number of vacuum chambers of a vapor-deposition apparatus being lined up, and a different vapor-deposition mask 1 being installed at each of the number of vacuum chambers, vapor deposition can be carried out continuously by moving the supporting substrate 21 (the substrate to be vapor-deposited 2) through each vapor-deposition apparatus.

Each time forming of each organic deposition layer 25 comprising the electron injection layer such as the LiF layer is completed, as described above, the electromagnet 3 is turned off, so that the electromagnet 3 is separated from the vapor-deposition mask 1. Thereafter, the second electrode (for example, the cathode) 26 is formed on the entire surface. As the example shown in FIG. 7B is for top emission, a technique in which light is emitted from a surface opposite the supporting substrate 21 in FIG. 7B, the second electrode 26 is formed with a light-transmitting material such as a thin-film Mg—Ag co-crystallized film, for example. Alternatively, Al can be used. For bottom emission, in which light is radiated via the supporting substrate 21, ITO or $In_3O_4$ is used for the first electrode 22, and a metal having a small work function, for example, Mg, K, Li, or Al, can be used for the second electrode 26. On a surface of this second electrode 26, a protective film 27 comprising $Si_3N_4$, for example, is formed. The above-mentioned entirety is sealed with a sealing layer such as a moisture-resistant resin film or glass (not shown) and is configured such that the organic deposition layer 25 is prevented from absorbing moisture. Moreover, the organic layer is made common as much as possible and a structure in which a color filter is provided on a surface thereof can be formed.

(Summary)

(1) A vapor-deposition mask according to a first embodiment of the present invention comprises: a mask main body at which an aperture pattern is formed; and a frame to which at least a portion of a peripheral edge of the mask main body is joined to hold the mask main body at a certain state, wherein the frame is formed with a carbon-fiber reinforced plastic.

The vapor-deposition mask according to one embodiment of the present invention uses a rigid material whose linear expansion coefficient and thermal conductivity are small and whose relative density is small to greatly reduce the weight of the vapor-deposition mask. As a result, this makes conveyance using a robot arm easier and substantial upsizing to approximately G8 or more can be realized, compared to the upper limit of approximately G6H for the size of a substrate to be vapor-deposited that is presently used in a manufacturing line of an organic-EL display apparatus.

(2) The carbon-fiber reinforced plastic being a silicon carbide fiber-reinforced plastic having silicon carbide as a reinforced plastic is preferable as the linear expansion coefficient thereof is close to that of the substrate to be vapor-deposited and the rigidity thereof is high.

(3) The frame being formed as a sandwich structure in which at least one end plate formed with the carbon-fiber reinforced plastic or a metal plate is bonded onto opposing surfaces at least a part of a columnar-shaped core portion enclosing a gap can make the frame more lightweight. Moreover, comprising the gap also causes the thermal capacity to be reduced, making it possible to also reduce heat accumulation.

(4) The gap being formed in a broadly-defined honeycomb structure makes it possible to obtain the rigidity that can even tolerate load in the horizontal direction that is applied on the core portion at which the gap is formed.

(5) In the vapor-deposition mask described in any of (1) to (4) in the above, the mask main body is a hybrid mask in which a resin film on which the aperture pattern is formed is bonded to a metal supporting layer comprising an aperture formed so as to not close the aperture pattern of the resin film.

(6) In a case that the mask main body is a metal mask comprising a thin metal plate on which the aperture pattern is formed, further tension is applied thereto compared to the tension applied to the hybrid mask, contributing to improvement in the strength of the frame.

(7) The frame having a frame-like rectangular shape and the gap being formed such that it faces the outside of the frame from the inside surrounded by the frame at a side of the frame to which the resin film is joined make it possible to obtain the rigidity that is sufficient against tension even when the mask main body is bonded to the frame with tension being applied.

(8) it is preferable that, with respect to the joining of a peripheral edge of the main mask body to the frame, a portion of the peripheral edge of the main mask body be bent to be joined to an outer peripheral side wall opposite to the inside of the frame. This makes it easier to obtain a sufficient rigidity even against tension of the mask main body.

(9) An end plate formed with a magnetic metal plate being bonded to the entire outer peripheral wall of the frame enclosing the gap, together with causing the rigidity against stress to be high, can prevent a vapor-deposition material such as an organic material from seeping into the gap or a cleaning agent at the time of cleaning from remaining in the gap. Moreover, the magnetic metal plate can be used to make it easier to allow adsorption with a magnet.

(10) The gap surrounded by the end plate being depressurized is preferable since a gas entering into the gap is prevented from flowing out even when the end plate is used within the vacuum chamber.

(11) A rare gas being filled inside the gap surrounded by the end plate is preferable since heat accumulation is suppressed.

(12) Moreover, a method of vapor deposition according to a second embodiment of the present invention comprises: arranging a substrate to be vapor-deposited and the vapor-deposition mask as described in one of (1) to (11) such that they overlap each other; and, depositing the vapor-deposited material onto the substrate to be vapor-deposited by causing a vapor-deposited material to fly away from a vapor-deposition source arranged at a distance from the vapor-deposition mask.

The vapor-deposition method according to the second embodiment of the present invention makes it easier to handle the vapor-deposition mask with a robot arm since the vapor-deposition mask is made very lightweight, and a further upsizing of the substrate is realized.

(13) The frame of the vapor-deposition mask having a frame-like rectangular shape and the substrate to be vapor-deposited and the vapor-deposition mask being arranged such that a side of the frame formed such that the gap faces the outside of the frame from the inside surrounded by the frame is positioned upward and downward causes a sufficient rigidity to be obtained even against the self-weight of the vapor-deposition mask.

(14) Furthermore, a method for manufacturing an organic-EL display apparatus according to a third embodiment of the present invention comprises: forming at least a TFT and a first electrode on a supporting substrate; vapor-depositing an organic material on the supporting substrate using the method of vapor deposition that is described in (10) or (11) in the above to form an organic deposition layer; and forming a second electrode on the organic deposition layer.

The method for manufacturing the organic-EL display apparatus according to the third embodiment of the present invention makes easier to install a vapor-deposition mask when the organic-EL display apparatus is manufactured and causes an uneven thermal expansion of the vapor-deposition mask and the substrate to be vapor-deposited to be suppressed, making it possible to suppress misalignment between the substrate to be vapor-deposited and the vapor-deposition mask and to obtain a display panel with a high-definition pattern.

DESCRIPTION OF REFERENCE NUMERALS

1 Vapor-deposition mask
2 Substrate to be vapor-deposited
3 Electromagnet
5 Vapor-deposition source
10 Mask main body
11 Resin film
11a Aperture
12 Metal supporting layer
12a Aperture
15 Frame
15a Vertical frame
15b Horizontal frame
150 Sandwich structure
151 Core Portion
151a Gap (Through hole)
151b Thin-walled portion
152 End plate
19 Mask holder
21 Supporting substrate
22 First electrode
23 Insulation bank
25 Organic deposition layer
26 Second electrode
29 Substrate holder

The invention claimed is:

1. A vapor-deposition mask comprising:
a mask main body at which an aperture pattern is formed; and
a frame to which at least a portion of a peripheral edge of the mask main body is joined to hold the mask main body at a certain state,
wherein the frame is formed with a carbon-fiber reinforced plastic;
wherein the frame is formed as a sandwich structure in which at least an end plate formed with the carbon-fiber reinforced plastic or a metal plate is bonded onto opposing surfaces at least a part of a columnar-shaped core portion enclosing a gap;
wherein a peripheral end plate is bonded to an entire outer peripheral wall of the frame enclosing the gap; and
wherein a rare gas is filled inside the gap surrounded by the peripheral end plate.

2. The vapor-deposition mask according to claim 1, wherein the carbon-fiber reinforced plastic is a silicon carbide fiber-reinforced plastic having silicon carbide as a reinforced plastic.

3. The vapor-deposition mask according to claim 1, wherein the gap of the columnar-shaped core portion is formed in a broadly-defined honeycomb structure.

4. The vapor-deposition mask according to claim 1, wherein the mask main body is a hybrid mask in which a resin film on which the aperture pattern is formed is bonded to a metal supporting layer comprising an aperture formed so as to not close the aperture pattern of the resin film.

5. The vapor-deposition mask according to claim 1, wherein the mask main body is a metal mask comprising a thin metal plate on which the aperture pattern is formed.

6. The vapor-deposition mask according to claim 1, wherein the frame has a frame-like rectangular shape and the gap is formed such that it faces an outside of the frame from an inside surrounded by the frame at a side of the frame to which the resin film is joined.

7. The vapor-deposition mask according to claim 1, wherein, with respect to joining of a peripheral edge of the mask main body to the frame, a portion of the peripheral edge of the mask main body is bent to be joined to an outer peripheral side wall opposite to the inside of the frame.

8. A method of vapor deposition, the method comprising:
arranging a substrate to be vapor-deposited and the vapor-deposition mask according to claim 1 such that they overlap each other; and,
depositing a vapor-deposited material onto the substrate to be vapor-deposited by causing a vapor-deposited material to fly away from a vapor-deposition source arranged at a distance from the vapor-deposition mask.

9. The method of vapor deposition according to claim 8, wherein the frame of the vapor-deposition mask has a frame-like rectangular shape and the frame is positioned in an upright position such that the frame intersects a horizontal plane, and the gap of an upper side or a lower side in the frame faces an outside of the frame from an inside surrounded by the frame.

10. A method of manufacturing an organic-EL display apparatus, the method comprising:
forming at least a TFT and a first electrode on a supporting substrate;
vapor-depositing an organic material on the supporting substrate using the method of vapor deposition according to claim 8 to form an organic deposition layer; and
forming a second electrode on the organic deposition layer.

* * * * *